US008274114B2

(12) United States Patent
Ito

(10) Patent No.: US 8,274,114 B2
(45) Date of Patent: Sep. 25, 2012

(54) SEMICONDUCTOR DEVICE HAVING A MODIFIED SHALLOW TRENCH ISOLATION (STI) REGION AND A MODIFIED WELL REGION

(75) Inventor: Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 202 days.

(21) Appl. No.: 12/656,054

(22) Filed: Jan. 14, 2010

(65) Prior Publication Data
US 2011/0169077 A1 Jul. 14, 2011

(51) Int. Cl.
*H01L 29/66* (2006.01)

(52) U.S. Cl. ........ 257/336; 257/328; 257/168; 257/339; 257/337; 257/E29.256; 257/E29.261; 257/E21.409

(58) Field of Classification Search .................. None
See application file for complete search history.

(56) References Cited

U.S. PATENT DOCUMENTS

| | | | |
|---|---|---|---|
| 4,902,639 A * | 2/1990 | Ford | 438/207 |
| 5,501,996 A | 3/1996 | Yang et al. | |
| 5,583,067 A * | 12/1996 | Sanchez | 438/289 |
| 5,742,084 A | 4/1998 | Yu | |
| 5,801,416 A | 9/1998 | Choi et al. | |
| 5,910,673 A | 6/1999 | Hsu et al. | |
| 5,918,133 A | 6/1999 | Gardner et al. | |
| 5,943,575 A | 8/1999 | Chung | |
| 6,034,388 A * | 3/2000 | Brown et al. | 257/296 |
| 6,077,749 A | 6/2000 | Gardner et al. | |
| 6,121,666 A | 9/2000 | Burr | |
| 6,177,324 B1 | 1/2001 | Song et al. | |
| 6,200,843 B1 | 3/2001 | Bryant et al. | |
| 6,204,537 B1 | 3/2001 | Ma | |
| 6,211,552 B1 * | 4/2001 | Efland et al. | 257/343 |
| 6,242,787 B1 | 6/2001 | Nakayama et al. | |
| 6,424,005 B1 | 7/2002 | Tsai et al. | |
| 6,441,431 B1 | 8/2002 | Efland et al. | |
| 6,465,307 B1 | 10/2002 | Chidambaram et al. | |
| 6,580,156 B1 | 6/2003 | Ito et al. | |
| 6,620,656 B2 | 9/2003 | Min et al. | |
| 6,700,176 B2 | 3/2004 | Ito et al. | |
| 6,707,112 B2 | 3/2004 | Kachelmeier | |
| 6,798,684 B2 | 9/2004 | Low et al. | |
| 6,888,205 B2 | 5/2005 | Moscatelli et al. | |
| 6,960,819 B2 | 11/2005 | Chen et al. | |
| 7,161,213 B2 | 1/2007 | Ito et al. | |
| 7,345,341 B2 | 3/2008 | Lin et al. | |
| 7,348,247 B2 | 3/2008 | Park et al. | |
| 7,405,443 B1 | 7/2008 | Zuniga et al. | |

(Continued)

*Primary Examiner* — Fei Fei Yeung Lopez
(74) *Attorney, Agent, or Firm* — Sterne, Kessler, Goldstein & Fox P.L.L.C.

(57) ABSTRACT

An apparatus is disclosed to increase a breakdown voltage of a semiconductor device. The semiconductor device includes a modified breakdown shallow trench isolation (STI) region to effectively reduce a drain to source resistance when compared to a conventional semiconductor device, thereby increasing the breakdown voltage of the semiconductor device when compared to the conventional semiconductor device. The modified breakdown STI region allows more current to pass from a source region to a drain region of the semiconductor device, thereby further increasing the break down voltage of the semiconductor device from that of the conventional semiconductor device. The semiconductor device may include a modified well region to further reduce the drain to source resistance of the semiconductor device. The modified breakdown STI region allows even more current to pass from a source region to a drain region of the semiconductor device, thereby further increasing the break down voltage of the semiconductor device from that of the conventional semiconductor device.

16 Claims, 9 Drawing Sheets

U.S. PATENT DOCUMENTS

| | | |
|---|---|---|
| 7,405,446 B2 | 7/2008 | Agam et al. |
| 7,462,906 B2 | 12/2008 | Lu et al. |
| 7,528,453 B2 | 5/2009 | Holz et al. |
| 7,602,017 B2 | 10/2009 | Cai |
| 7,855,414 B2 | 12/2010 | Ito et al. |
| 2002/0072159 A1 | 6/2002 | Nishibe et al. |
| 2003/0127689 A1 | 7/2003 | Hebert |
| 2004/0157379 A1 | 8/2004 | Ito et al. |
| 2005/0052892 A1 | 3/2005 | Low et al. |
| 2005/0236666 A1 | 10/2005 | Wang |
| 2006/0124999 A1 | 6/2006 | Pendharkar |
| 2006/0261408 A1 | 11/2006 | Khemka et al. |
| 2008/0023760 A1 | 1/2008 | Ito et al. |
| 2008/0036033 A1 | 2/2008 | Ito et al. |
| 2008/0054375 A1* | 3/2008 | Williford ............ 257/402 |
| 2008/0164537 A1 | 7/2008 | Cai |
| 2008/0246080 A1 | 10/2008 | Ito et al. |
| 2008/0315306 A1* | 12/2008 | Yoo et al. ............ 257/339 |
| 2009/0032868 A1 | 2/2009 | Chen et al. |
| 2010/0090278 A1* | 4/2010 | Rohrer ............ 257/339 |
| 2010/0096697 A1 | 4/2010 | Su et al. |
| 2010/0295125 A1 | 11/2010 | Ito |
| 2010/0295126 A1 | 11/2010 | Ito |
| 2011/0057271 A1 | 3/2011 | Ito et al. |
| 2011/0303978 A1 | 12/2011 | Ito |

* cited by examiner

US 8,274,114 B2

SEMICONDUCTOR DEVICE HAVING A MODIFIED SHALLOW TRENCH ISOLATION (STI) REGION AND A MODIFIED WELL REGION

FIELD OF THE INVENTION

The present invention generally relates to semiconductors. More specifically, the invention relates to increasing a breakdown voltage of a semiconductor device.

BACKGROUND OF THE INVENTION

Silicon semiconductor processing has evolved sophisticated operations for fabricating integrated circuits. As advancement in fabrication process technology continues, the operating voltage of the integrated circuits has decreased, but the operating voltage of auxiliary devices remains the same. Auxiliary devices are devices used in conjunction with integrated circuits and may include printers, scanners, disk drives, tape drives, microphones, speakers, and cameras to provide some examples.

Auxiliary devices may operate at voltages above the breakdown voltage of the transistors contained within the integrated circuit. As the operating voltage applied to a transistor increases, the transistor will eventually breakdown allowing an uncontrollable increase in current to pass through the junction. Breakdown voltage is the voltage level where this uncontrollable increase in current occurs. Examples of breakdown may include punch-through, avalanche breakdown, and gate oxide breakdown to provide some examples. Operating above the breakdown voltage for a significant duration reduces the lifetime of the transistor.

Techniques are currently available to increase the voltage at which breakdown occurs. These techniques may include the separate design of input-output circuits using a high voltage process, double diffused drain or other extended drain techniques, or the cascading of two individual transistors to provide some examples. These techniques often increase the fabrication cost by requiring additional process steps along with additional substrate masking.

What is needed is a metal oxide semiconductor field effect transistor (MOSFET) device that addresses one or more of the aforementioned shortcomings of conventional MOSFET devices.

BRIEF DESCRIPTION OF THE DRAWINGS/FIGURES

The accompanying drawings illustrate the present invention and, together with the description, further serve to explain the principles of the invention and to enable one skilled in the pertinent art to make and use the invention.

Figure 1A:
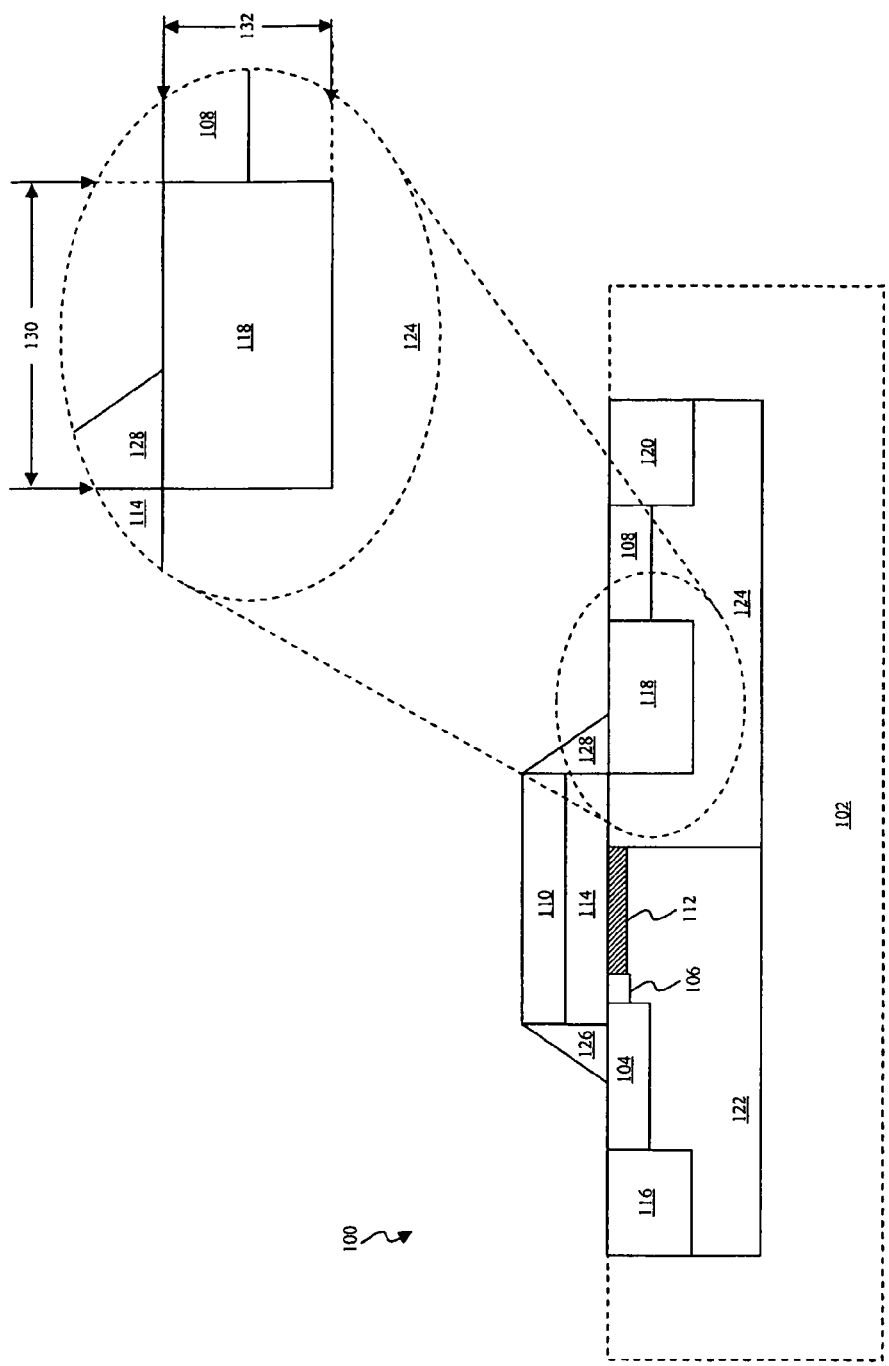
FIG. 1A illustrates a cross-sectional view of a conventional n-type laterally diffused metal oxide semiconductor (LDMOS) fabricated using a conventional complementary metal oxide semiconductor (CMOS) logic foundry technology.

The present invention will now be described with reference to the Accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner. Likewise, particular bit values of "0" or "1" (and representative voltage values) are used in illustrative examples provided herein to represent information for purposes of illustration only. Information described herein may be represented by either bit value (and by alternative voltage values), and embodiments described herein may be configured to operate on either bit value (and any representative voltage value), as would be understood by persons skilled in the relevant art(s). It should be understood that relative spatial descriptions between one or more particular features, structures, or characteristics (e.g., "vertically aligned," "contact," etc.) used herein are for purposes of illustration only, and that practical implementations of the structures described herein may include fabrication and/or misalignment tolerances without departing from the spirit and scope of the present invention.

The example embodiments described herein are provided for illustrative purposes, and are not limiting. Further structural and operational embodiments, including modifications/alterations, will become apparent to persons skilled in the relevant art(s) from the teachings herein.

Fabrication of a Conventional Laterally Diffused Metal Oxide Semiconductor (LDMOS) Structure FIG. 1A illustrates a cross-sectional view of a conventional n-type laterally diffused metal oxide semiconductor (LDMOS) fabricated using a conventional complementary metal oxide semiconductor (CMOS) logic foundry technology. The conventional CMOS logic foundry technology fabricates a conventional LDMOS structure 100 onto a substrate 102 of one conductivity type. The substrate 102 represents a physical material on which the conventional CMOS logic foundry technology fabricates the conventional LDMOS structure 100. For example, in the exemplary embodiment of FIG. 1A, the conventional CMOS logic foundry technology fabricates the conventional LDMOS structure 100 onto the substrate 102 composed with a p-type material. The p-type material includes impurity atoms of an acceptor type, such as, but not limited to, boron or aluminum to provide some examples, that are capable of accepting an electron. Doping the substrate 102 with the p-type material causes a carrier hole density in the substrate 102 to exceed a carrier electron density.

A first heavily doped region of opposite conductivity as the substrate 102 represents a source region 104 of the conventional LDMOS structure 100. Generally, implanting a comparatively small number of atoms, approximately $$\frac{5 \times 10^{18}}{cm^3} \text{ to } \frac{1 \times 10^{19}}{cm^3},$$

refers to an implanting that is low or light. Similarly, implanting a comparatively large number of atoms, approximately $$\frac{1 \times 10^{19}}{cm^3} \text{ to } \frac{5 \times 10^{20}}{cm^3},$$

refers to an implanting that is high or heavy. The source region 104 may optionally include a lightly doped region, often referred to as an LDD region 106. The LDD region 106 is of substantially similar conductivity as the source region 104 with a lesser doping density when compared to a doping density of the source region 104.

A second heavily doped region of opposite conductivity as the substrate 102 represents a drain region 108 of the conventional LDMOS structure 100. The conventional CMOS logic foundry technology implants the source region 104 and the drain region 108 with N+ material to form a first N+ region and a second N+ region corresponding to the source region 104 and the drain region 108, respectively. The "+" indicates that the region is implanted with a higher carrier concentration than a region not designated by a "+." For instance, an N+ region generally has a greater number of excess carrier electrons than an n-type region. A P+ region typically has a greater number of excess carrier holes than a p-type substrate. The conventional CMOS logic foundry may optionally implant the LDD region 106 with n-type material having a doping density less than a doping density of the first N+ region and/or the second N+ region. The n-type material includes impurity atoms of a donor type, such as, but not limited to, phosphorus, arsenic, or antimony to provide some examples; that are capable of donating an electron. Implanting the source region 104 and/or the drain region 108 with the n-type material causes the carrier electron density in the source region 104 and/or the drain region 108 to exceed a carrier hole density.

A third heavily doped region of opposite conductivity as the substrate 102 represents a gate region 110 of the conventional LDMOS structure 100. The conventional CMOS logic foundry technology heavily implants polycrystalline silicon with the opposite conductivity as the substrate 102 to form the gate region 110. For example, the conventional CMOS logic foundry technology implants the polycrystalline silicon with the N+ material to form an N+ poly region corresponding to the gate region 110.

The conventional LDMOS structure 100 may form a part of an interconnected array of active and passive elements integrated with or deposited on the substrate 102 by a continuous series of compatible processes known as an integrated circuit. The conventional LDMOS structure 100 includes shallow trench isolation (STI) regions to provide isolation and/or protection for the conventional LDMOS structure 100 from neighboring active and passive elements integrated with or deposited on the substrate 102. A first STI region 116 and a second STI region 120 provides isolation and protection for the conventional LDMOS structure 100. The first STI region 116 is adjacent to a first side of the source region 104. Likewise, the second STI region 120 is adjacent to a first side of the drain region 108. The first STI region 116 and/or the second STI region 120 contact their respective sides of the source region 104 and/or the drain region 108. The conventional LDMOS structure 100 further includes a breakdown STI region 118 to increase a breakdown voltage of the conventional LDMOS structure 100 when compared to a similar LDMOS structure that does not include the breakdown STI region 118. The conventional CMOS logic foundry technology uses a dielectric material such as $SiO_2$, though any suitable material may be used, to fabricate the first STI region 116, the breakdown STI region 118, and/or the second STI region 120.

The conventional LDMOS structure 100 additionally includes spacers to provide isolation and/or protection between the source region 104, the drain region 108, and/or a gate region 110. The conventional LDMOS structure 100 includes a first spacer 126 between the source region 104 and the gate region 110 to isolate and/or protect the source region 104 and the gate region 110. Likewise, the conventional LDMOS structure 100 includes a second spacer 128 between a top side of the drain region 108 and a second side of the gate region 110. The first spacer 126 and/or the second spacer 128 contact the respective sides of the source region 104 and/or the drain region 108. The conventional CMOS logic foundry technology fabricates the second spacer 128 and/or the first spacer 126 using a dielectric material, such as $SiO_2$, though any suitable material may be used.

The conventional CMOS logic foundry technology accommodates a minimum size, such as a length, width, and/or height for at least some of the regions of the conventional LDMOS structure 100 and/or a minimum distance between two or more of the regions of the conventional LDMOS structure 100 as defined by one or more minimum design rules (MDRs), such a minimum space interval or a minimum overlap area to provide some examples. These minimum design rules represent limits a resolution of photolithographic processing used by the conventional CMOS logic foundry technology used between one or more masks used to manufacture the conventional LDMOS structure 100. For example, as shown in FIG. 1A, the breakdown STI region 118 includes a minimum width 130 and a minimum height 132. The minimum width 130 represents a smallest horizontal distance, i.e., width, of the breakdown STI region 118 that the conventional CMOS logic foundry technology may accommodate. The minimum height 132 represents a smallest vertical distance, i.e., height, of the breakdown STI region 118 that the conventional CMOS logic foundry technology may accommodate. For example, the minimum width 130 is approximately 0.11 μm for a 65 nm minimum design rule foundry technology and the minimum height 132 varies from approximately 0.2 μm to approximately 0.25 μm from one 65 nm minimum design rule foundry technology to another.

The conventional LDMOS structure 100 is described in further detail in U.S. patent application Ser. No. 12/155,628, filed Jun. 6, 2008, entitled "Shallow Trench Isolation (STI) Based Laterally Diffused Metal Oxide Semiconductor (LDMOS)" which is incorporated herein by reference in its entirety.

Operation of the Conventional LDMOS Structure

Applying a first potential, such as a positive direct current (DC) voltage to provide an example, to the gate region 110 and applying a second potential, such as a ground potential to provide an example, to the source region 104 causes a voltage to appear between the gate region 110 and the source region 104. The first potential on the gate region 110 repels the positively charged carrier holes from a bottom side of the gate region 110 forming a channel region 112. The channel region 112 represents a carrier-depletion region populated by a negative charge formed at a bottom side of a gate oxide 114 by an electric field. This electric field also attracts carrier electrons from the source region 104 and the drain region 108 into the channel region 112. An n-type region connecting the source region 104 to the drain region 108 forms after a sufficient number of carrier electrons have accumulated in the channel region 112 allowing a current to pass through the channel region 112.

Specially implanted regions, known as wells, may increase the number of carrier holes and/or carrier electrons located in the substrate 102. For example, increasing the number of carrier holes in the substrate 102 requires a greater number of carrier electrons to form the depletion region. A specially implanted p-type region, known as a p-well 122, is adjacent to a bottom side of the source region 104, the gate region 110, and the first STI region 116. The p-well 122 extends from a first side located under the first STI region 116 to a second side located under the gate region 110. The conventional CMOS logic foundry technology may implant the substrate 102 with the p-type material to fabricate the p-well 122. Likewise, a specially implanted n-type region, known as an n-well region 124, is located below the drain region 106, the gate region 110, and the second STI region 120. The n-well region 124 extends from a first side located under the second STI region 120 to a second side located under the gate region 110. The conventional CMOS logic foundry technology may implant the substrate 102 with the n-type material to fabricate the n-well region 124. The second side of the p-well 122 may contact the second side of the n-well region 124.

Doping Profile of the N-Well Region

Figure 1B:
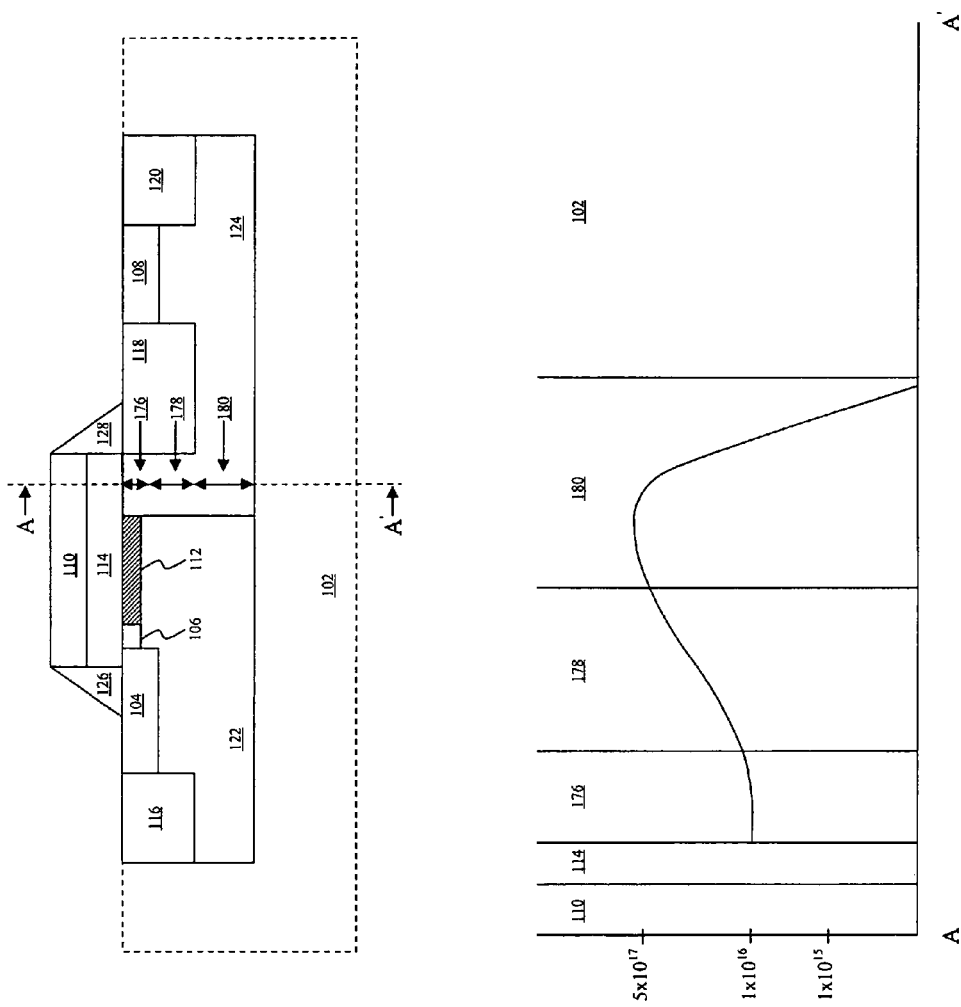
FIG. 1B illustrates a doping profile of an n-well region formed within the conventional n-type LDMOS.

FIG. 1B illustrates a doping profile of an n-well region formed within the conventional n-type LDMOS. In particular, FIG. 1B illustrates the doping profile of the n-well region 124 along a cross section of the conventional n-type LDMOS structure designated by the broken line A-A'. As shown in FIG. 1B, the broken line A-A' passes through the gate region 110, the gate oxide 114, a first region 176 of the n-well region 124, a second region 178 of the n-well region 124, a third region 180 of the n-well region 124, and the substrate 102. The first region 176 represents a portion of the n-well region 124 extending from the bottom of the gate oxide 114 until substantially horizontally aligned with the bottom side of the channel region 112. The second region 178 extends from the first region 176 until substantially horizontally aligned with the bottom side of the breakdown STI region 118. The third region 180 extends from the second region 178 to a bottom side of the n-well region 124.

As further shown in FIG. 1B, the conventional CMOS logic foundry technology may lightly implant the substrate 102 with a high energy implant having a doping density between approximately $$\frac{1 \times 10^{16} \text{ atoms}}{\text{cm}^3}$$

and approximately $$\frac{5 \times 10^{17} \text{ atoms}}{\text{cm}^3}$$

to form the n-well region 124. The conventional CMOS logic foundry technology may concentrate the high energy implant into the third region 180 during formation of the n-well region 124 such that the doping destiny of the first region 176 and/or the second region 178 is less than the doping destiny of the third region 180 with the first region 176 having the lightest doping density.

Breakdown Voltage of the Conventional LDMOS Structures

There is a point, known as the breakdown voltage, where the current passing through the channel region 112 increases uncontrollably resulting in breakdown of the conventional LDMOS structure 100. Examples of breakdown may include avalanche breakdown, punch-through, and/or gate oxide breakdown to provide some examples. A drain to source resistance of the conventional LDMOS structure 100, namely a resistance from the drain region 108 to the source region 104, influences the breakdown voltage. For example, the breakdown voltage of a semiconductor device having a higher drain to source resistance is larger when compared to a substantially similar semiconductor device having a lower drain to source resistance.

Figure 1C:
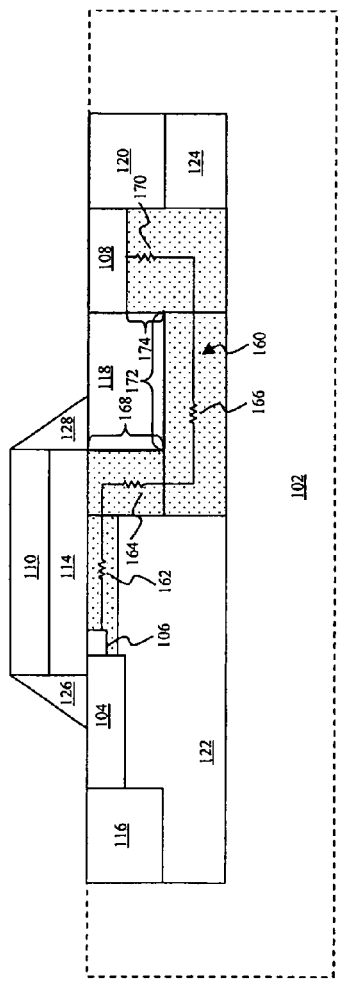
FIG. 1C illustrates a cross-sectional view of a drain to source resistance of the conventional n-type LDMOS.

FIG. 1C illustrates a cross-sectional view of a drain to source resistance of the conventional n-type LDMOS. More specifically, FIG. 1C illustrates the cross-sectional view of a drain to source resistance 160 of the conventional LDMOS structure 100 in an on-state, namely after the sufficient number of carrier electrons have accumulated in the channel region 112 allowing the current to pass through the channel region 112.

As illustrated in FIG. 1C the drain to source resistance 160 may be represented by multiple serial drain to source resistances. A first drain to source resistance 162 extends substantially horizontally from the source region 104, or the from the LDD region 106, to the n-well region 124. The first drain to source resistance 162 includes the channel region 112. A second drain to source resistance 164 extends substantially vertically from the first drain to source resistance 162 to a third drain to source resistance 166. The second drain to source resistance 164 represents a drain to source resistance of the n-well region 124 along a first vertical side 168 of the breakdown STI region 118. The third drain to source resistance 166 extends substantially horizontally from the second drain to source resistance 164 to a fourth drain to source resistance 170. The third drain to source resistance 166 represents a drain to source resistance of the n-well region 124 along a first horizontal side 172 of the breakdown STI region 118. The fourth drain to source resistance 170 extends substantially vertically from the third drain to source resistance 166 to the drain region 108. The fourth drain to source resistance 170 represents a drain to source resistance of the n-well region 124 along a second vertical side 174 of the breakdown STI region 118.

Voltage Potential Profile of the Conventional LDMOS Structure

Figure 1D:
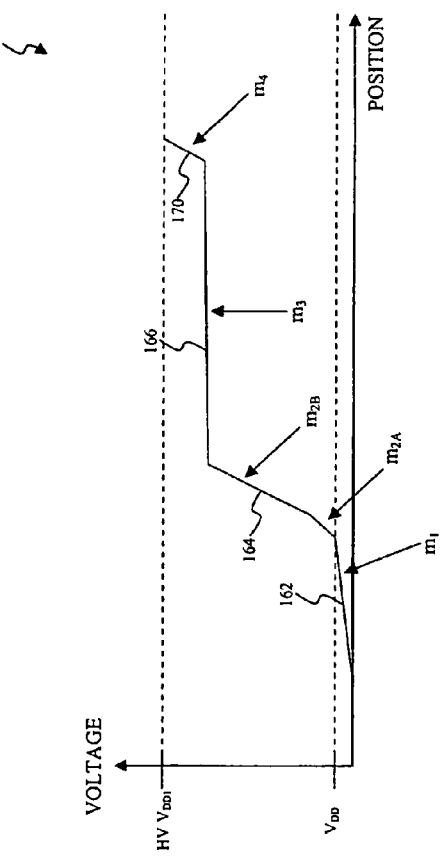
FIG. 1D illustrates a voltage potential profile of the conventional n-type LDMOS.

FIG. 1D illustrates a voltage potential profile of the conventional n-type LDMOS. More specifically, FIG. 1D illustrates a voltage potential profile 180 of the conventional LDMOS structure 100 as a function of position and voltage. The voltage potential profile 180 represents a voltage dissipated by the drain to source resistance 160 along the depletion region extending from the source region 104 to the drain region 108. The first drain to source resistance 162 dissipates from approximately zero volts to approximately a first voltage VDD. The second drain to source resistance 164 through the fourth drain to source resistance 170 dissipate from approximately the first voltage $V_{DD}$ to approximately a first high voltage HV $V_{DD1}$, the first high voltage HV $V_{DD1}$ being greater than the first voltage $V_{DD}$.

The voltage potential profile of the first drain to source resistance 162 increases at a first rate $m_1$ as a function of position such that the voltage potential at the source region 104, or at the LDD region 106, is less than the voltage potential at the second drain to source resistance 164. The first rate $m_1$ represents a rate of increase of the voltage potential of the first drain to source resistance 162 along the depletion region extending from the source region 104 to the second drain to source resistance 164.

The voltage potential profile of the second drain to source resistance 164 increases at a second rate $m_2$ as a function of position such that the voltage potential at the second drain to source resistance 164 is less than the voltage potential at the third drain to source resistance 166. The second rate $m_2$ represents a rate of increase of the voltage potential of the second drain to source resistance 164 along the depletion region extending from the first drain to source resistance 162 to the third drain to source resistance 166.

As shown in FIG. 1D, the second rate $m_2$ may include a first portion $m_{2A}$ and a second portion $m_{2B}$. The first portion $m_{2A}$ represents a rate of increase of the voltage potential of the second drain to source resistance 164 along the depletion region extending from the gate oxide 114, along a first vertical side 168 of the breakdown STI region 118, until substantially horizontally aligned with a bottom side of the channel region 112. The second portion $m_{2B}$ represents a rate of increase of the voltage potential of the second drain to source resistance 164 along the depletion region extending from the first portion $m_{2A}$, along the first vertical side 168, to the third drain to source resistance 166. The second portion $m_{2B}$ extends substantially vertically from the first portion $m_{2A}$, along the first horizontal side 172, to the third drain to source resistance 166.

The voltage potential profile of the third drain to source resistance 166 increases at a third rate $m_3$ as a function of position such that the voltage potential at the third drain to source resistance 166 is less than the voltage potential at the fourth drain to source resistance 168. The third rate $m_3$ represents a rate of increase of a voltage potential of the third drain to source resistance 166 along the depletion region extending from the second drain to source resistance 164, along the first horizontal side 172, to the fourth drain to source resistance 170.

The voltage potential profile of the fourth drain to source resistance 170 increases at a fourth rate $m_4$ as a function of position such that the voltage potential at the fourth drain to source resistance 170 is less than the voltage potential at the drain region 108. The fourth rate $m_4$ represents a rate of increase of a voltage potential of the fourth drain to source resistance 170 along the depletion region extending from the third drain to source resistance 166, along a second vertical side 174 of the breakdown STI region 118, to the drain region 108.

Figure 2A:
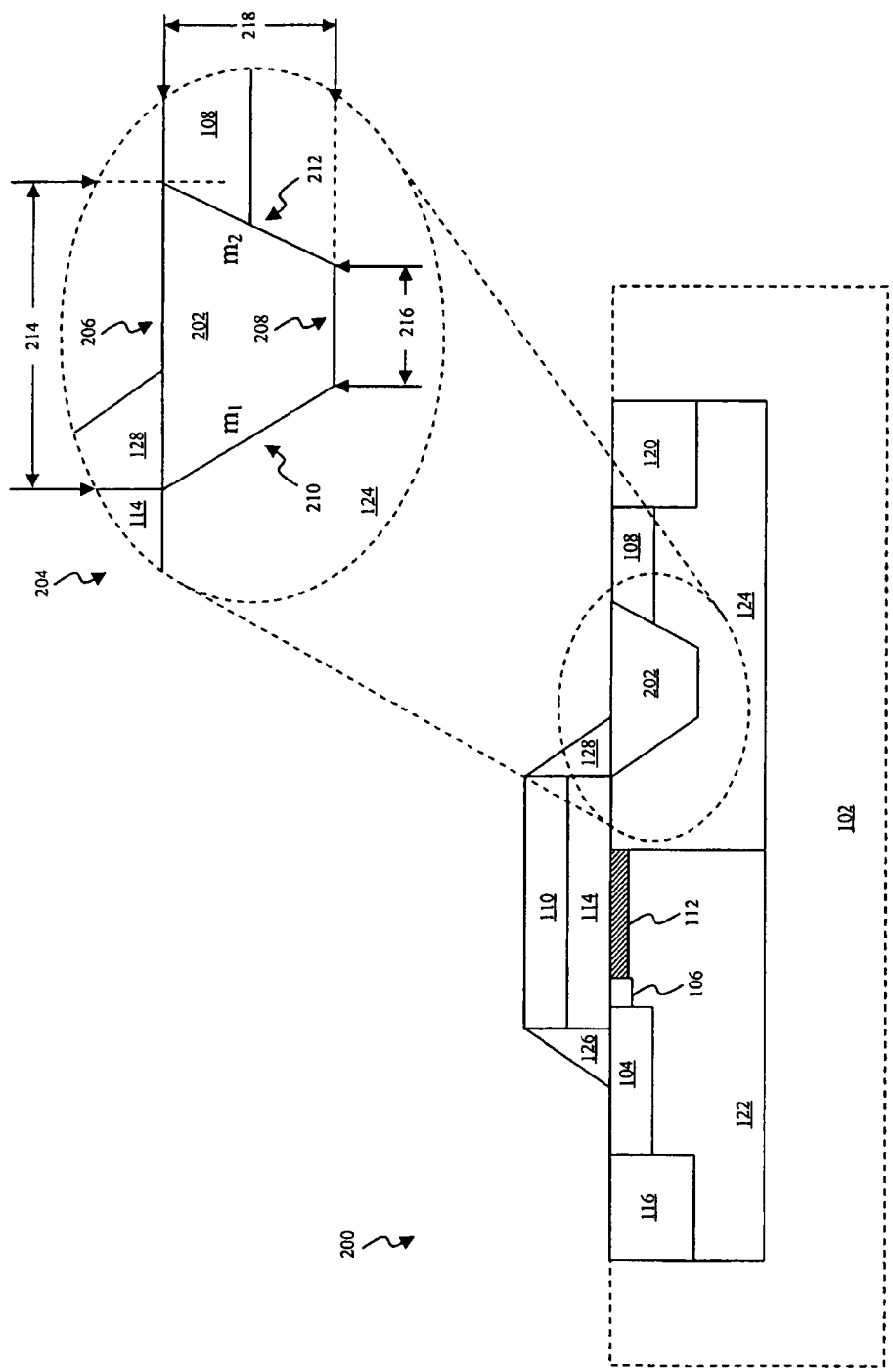
FIG. 2A illustrates a cross-sectional view of a first n-type LDMOS structure fabricated using a CMOS logic foundry technology according to a first exemplary embodiment.

Fabrication of a First Laterally Diffused Metal Oxide Semiconductor (LDMOS) Structure According to a First Exemplary Embodiment FIG. 2A illustrates a cross-sectional view of a first n-type LDMOS structure fabricated using a CMOS logic foundry technology according to a first exemplary embodiment. A LDMOS structure 200 may be characterized as including a lesser drain to source resistance when compared to the drain to source resistance of the conventional LDMOS structure 100. The LDMOS structure 200 includes a modified breakdown STI region to effectively reduce the drain to source resistance of the LDMOS structure 200 when compared to the conventional LDMOS structure 100. This decrease in the drain to source resistance of the LDMOS structure 200 further increases the breakdown voltage of the LDMOS structure 200 when compared to the conventional LDMOS structure 100. More specifically, the breakdown STI region 118 of the conventional LDMOS structure 100 increases the drain to source resistance of the conventional LDMOS structure 100, thereby increasing the breakdown voltage of the conventional LDMOS structure 100. The breakdown STI region 118, however, restricts the current passing from the source region to the drain region. The modified breakdown STI region in FIG. 2A reduces this restriction from the breakdown STI region 118 while maintaining the benefits of the increase in breakdown voltage. As a result, more current may pass from the source region to the drain region of the LDMOS structure 200, thereby further increasing the break down voltage of the LDMOS structure 200 from that of the conventional LDMOS structure 100. A metal oxide semiconductor (CMOS) logic foundry technology fabricates the LDMOS structure 200 in a substantially similar manner as the conventional LDMOS structure 100 as described above. Therefore, only differences between the LDMOS structure 200 and the conventional LDMOS structure 100 are to be described in further detail.

The LDMOS structure 200 includes a modified breakdown STI region 202 to decrease the drain to source resistance of the LDMOS structure 200 when compared to the drain to source resistance of the conventional LDMOS structure 100 while further increasing the breakdown voltage when compared to the conventional LDMOS structure 100 as described above. The CMOS logic foundry technology fabricates the modified breakdown STI region 202 between the source region 104 and the drain region 108 within the n-well region 124. In particular, the CMOS logic foundry technology fabricates the modified breakdown STI region 202 adjacent to the drain region 108 whereby at least some of the modified breakdown STI region 202 is positioned below the second spacer 128.

As shown in an exploded view 204 of FIG. 2A, the modified breakdown STI region 202 includes a top edge 206, a bottom edge 208, a first slanted edge 210, and a second slanted edge 212. The top edge 206, the bottom edge 208, the first slanted edge 210, and the second slanted edge 212 are configured to form a quadrilateral, such as a trapezoid to provide an example. However, those skilled in the relevant art(s) will recognize that other quadrilaterals such as a trapezium, a parallelogram, a rhombus, or a kite to provide some are examples, are possible without departing from the spirit and scope of the present invention. In an exemplary embodiment, the top edge 206 is characterized as having a horizontal length 214 of approximately 0.08 μm and the bottom edge 208 is characterized as having a horizontal length 216 of approximately 0.06 μm. In this exemplary embodiment, the first slanted edge 210 and the second slanted edge 212 are configured and arranged such that a vertical length 218 of the modified breakdown STI region 202 is between approximately 0.30 μm and approximately 0.35 μm. In another exemplary embodiment, the bottom edge 208 is characterized as having a horizontal length 216 of approximately 0 μm. In this exemplary embodiment, the top edge 206, the bottom edge 208, the first slanted edge 210, and the second slanted edge 212 are configured and arranged to form a triangle.

As further shown in exploded view 204, the first slanted edge 210 connects a first end of the top edge 206 to a first end of the bottom edge 208, whereas the second slanted edge 212 connects a second end of the top edge 206 to a second end of the bottom edge 208. As a result of the horizontal length 214 of the top edge 206 being greater than the horizontal length 216 of the bottom edge 208, the first slanted edge 210 and the second slanted edge 212 may each be characterized as having a slope $m_1$ and $m_2$, respectively, greater than zero. This slope of the first slanted edge 210 and the second slanted edge 212 allows for more current to pass from the source region 104 to the drain region 108, thereby reducing the drain to source resistance, of the LDMOS structure 200 when compared to the conventional LDMOS structure 100. As a result, the breakdown voltage of the LDMOS structure 200 is increased when compared to the breakdown voltage of the conventional LDMOS structure 100.

Breakdown Voltage of the First LDMOS Structure

Figure 2B:
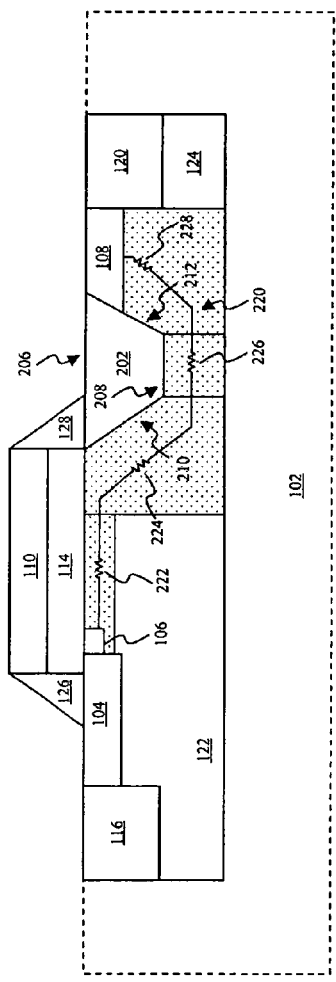
FIG. 2B illustrates a cross-sectional view of a drain to source resistance of the first n-type LDMOS structure according to an exemplary embodiment of the present invention.

FIG. 2B illustrates a cross-sectional view of a drain to source resistance of the first n-type LDMOS structure according to an exemplary embodiment of the present invention. More specifically, FIG. 2B illustrates the cross-sectional view of a drain to source resistance 220 of the LDMOS structure 200 in an on-state, namely after the sufficient number of carrier electrons have accumulated in the channel region 112 allowing the current to pass through the channel region 112.

As illustrated in FIG. 2B, the drain to source resistance 220 may be represented by multiple serial drain to source resistances. A first drain to source resistance 222 extends substantially horizontally from the source region 104, or the from the LDD region 106, to the n-well region 124. The first drain to source resistance 222 includes the channel region 112. A second drain to source resistance 224 extends substantially vertically from the first drain to source resistance 222 to a third drain to source resistance 226. The second drain to source resistance 224 represents a drain to source resistance of the n-well region 124 along the first slanted edge 210 of the modified breakdown STI region 202. The third drain to source resistance 226 extends substantially horizontally from the second drain to source resistance 224 to a fourth drain to source resistance 228. The third drain to source resistance 226 represents a drain to source resistance of the n-well region 124 along the bottom edge 208 of the modified breakdown STI region 202. The fourth drain to source resistance 228 extends substantially vertically from the third drain to source resistance 226 to the drain region 108. The fourth drain to source resistance 228 represents a drain to source resistance of the n-well region 124 along the second slanted edge 212 of the modified breakdown STI region 202.

Voltage Potential Profile of the First LDMOS Structure

Figure 2C:
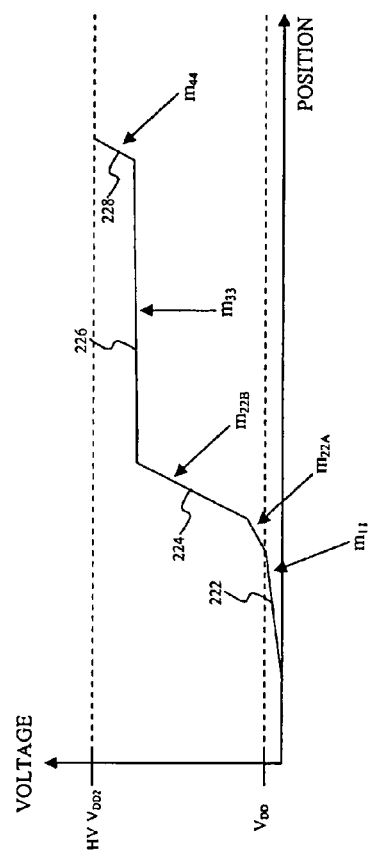
FIG. 2C illustrates a voltage potential profile of the first n-type LDMOS structure according to an exemplary embodiment of the present invention.

FIG. 2C illustrates a voltage potential profile of the first n-type LDMOS structure according to an exemplary embodiment of the present invention. More specifically, FIG. 2C illustrates a voltage potential profile 230 of the LDMOS structure 200 as a function of position and voltage. The voltage potential profile 230 represents a voltage dissipated by the drain to source resistance 220 along the depletion region extending from the source region 104 to the drain region 108. The first drain to source resistance 222 dissipates from approximately zero volts to approximately a first voltage VDD. The second drain to source resistance 224 through the fourth drain to source resistance 228 dissipate from approximately the first voltage $V_{DD}$ to approximately a second high voltage HV $V_{DD2}$, the second high voltage HV $V_{DD2}$ being greater than the first high voltage HV $V_{DD1}$.

The voltage potential profile of the first drain to source resistance 222 increases at a first rate $m_{11}$ as a function of position such that the voltage potential at the source region 104, or at the LDD region 106, is less than the voltage potential at the second drain to source resistance 224. The first rate $m_{11}$ represents a rate of increase of the voltage potential of the first drain to source resistance 222 along the depletion region extending from the source region 104 to the second drain to source resistance 224.

The voltage potential profile of the second drain to source resistance 224 increases at a second rate $m_2$ as a function of position such that the voltage potential at the second drain to source resistance 224 is less than the voltage potential at the third drain to source resistance 226. The second rate $m_{22}$ represents a rate of increase of the voltage potential of the second drain to source resistance 224 along the depletion region extending from the first drain to source resistance 222 to the third drain to source resistance 226.

As shown in FIG. 2C, the second rate $m_{22}$ may include a first portion $m_{22A}$ and a second portion $m_{22B}$. The first portion $m_{22A}$ represents a rate of increase, of the voltage potential of the second drain to source resistance 224 along the depletion region extending from the gate oxide 114, along the first slanted edge 210, until substantially horizontally aligned with a bottom side of the channel region 112. The first portion $m_{22A}$ is less than the first portion $m_{2A}$ as described in FIG. 1D. More specifically, the first slanted edge 210 allows for more current to pass from the source region 104 to the drain region 108, thereby reducing the drain to source resistance of the LDMOS structure 200 when compared to the conventional LDMOS structure 100. As a result, the voltage potential of the second drain to source resistance 224 along the depletion region in this region within the n-well region 124 increases at a rate that is less than a similar region with the n-well region 124 of the conventional LDMOS structure 100.

The second portion $m_{22B}$ represents a rate of increase of the voltage potential of the second drain to source resistance 224 along the depletion region extending from the first portion $m_{22A}$, along the first slanted edge 210, to the third drain to source resistance 226. The second portion $m_{22B}$ extends substantially vertically from the first portion $m_{22A}$, along the first slanted edge 210, to the third drain to source resistance 226.

The voltage potential profile of the third drain to source resistance 226 increases at a third rate $m_{33}$ as a function of position such that the voltage potential at the third drain to source resistance 226 is less than the voltage potential at the fourth drain to source resistance 228. The third rate $m_{33}$ represents a rate of increase of a voltage potential of the third drain to source resistance 226 along the depletion region extending from the second drain to source resistance 224, along the bottom edge 208, to the fourth drain to source resistance 228.

The voltage potential profile of the fourth drain to source resistance 228 increases at a fourth rate $m_{44}$ as a function of position such that the voltage potential at the fourth drain to source resistance 228 is less than the voltage potential at the drain region 108. The fourth rate $m_4$ represents a rate of increase of a voltage potential of the fourth drain to source resistance 228 along the depletion region extending from the third drain to source resistance 226, along the second horizontal side 174, to the drain region 108.

Figure 3A:
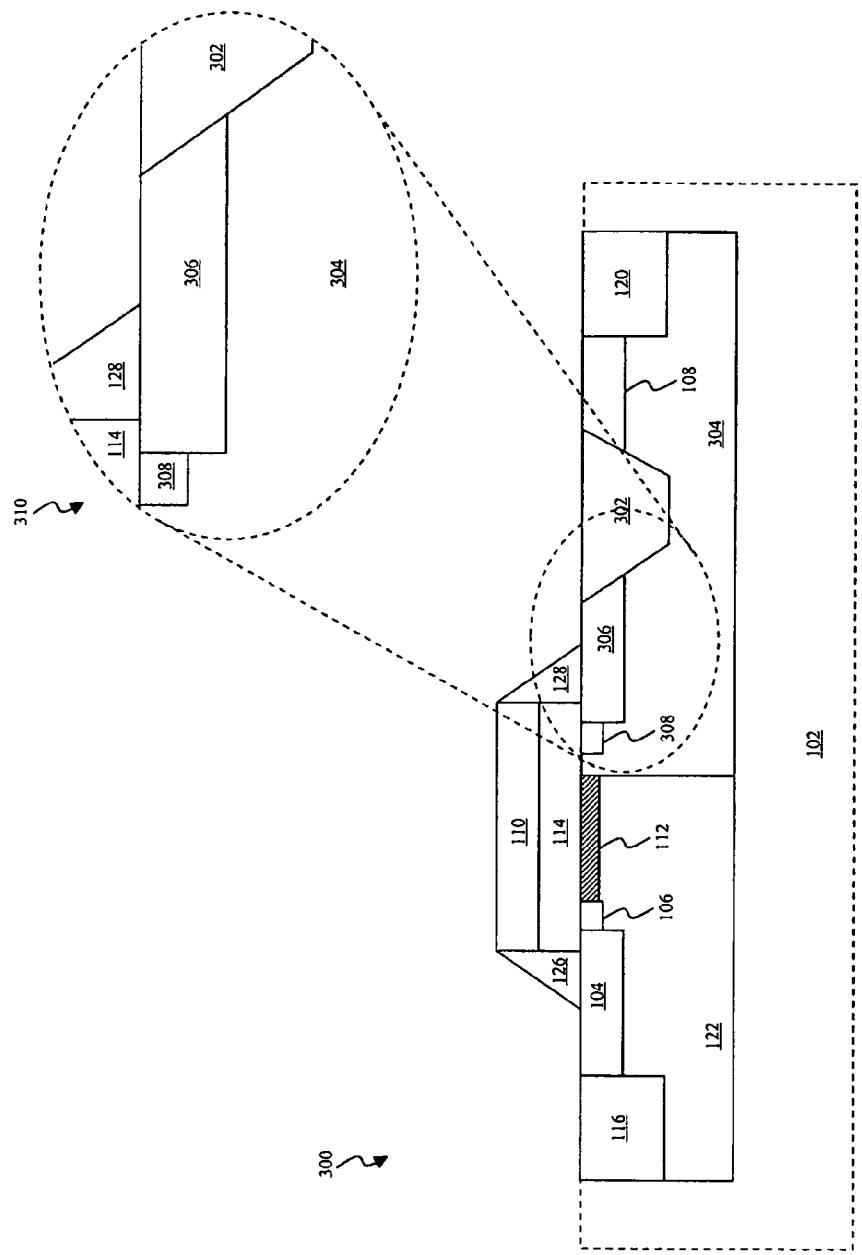
FIG. 3A illustrates a cross-sectional view of a second n-type LDMOS structure fabricated using a CMOS logic foundry technology according to a second exemplary embodiment.

Fabrication of a Second Laterally Diffused Metal Oxide Semiconductor (LDMOS) Structure According to a Second Exemplary Embodiment FIG. 3A illustrates a cross-sectional view of a second n-type LDMOS structure fabricated using a CMOS logic foundry technology according to a second exemplary embodiment. A LDMOS structure 300 may be characterized by a lower drain to source resistance when compared to the drain to source resistance of the LDMOS structure 200. In addition to the modified breakdown STI region as described above, the LDMOS structure 300 includes a modified well region to effectively reduce a drain to source resistance of the LDMOS structure 300 when compared to the LDMOS structure 200. The modified well region further increases the breakdown voltage of the LDMOS structure 300 when compared to the LDMOS structure 200. More specifically, the modified breakdown STI region 202 of the LDMOS structure 200 decreases the drain to source resistance of the LDMOS structure 200, thereby increasing the breakdown voltage of the LDMOS structure 200. The n-well region 124, however, restricts the current passing from the source region to the drain region. The modified well region reduces this restriction from the n-well region 124 while maintaining the benefits of the increase in breakdown voltage. As a result, more current may pass from the source region to the drain region of the LDMOS structure 300, thereby further increasing the breakdown voltage of the LDMOS structure 300 from that of the LDMOS structure 200. The CMOS logic foundry technology fabricates the LDMOS structure 300 in a substantially similar manner as the LDMOS structure 200 described above. Therefore, only differences between the LDMOS structure 300 and the LDMOS structure 200 are to be described in further detail.

The LDMOS structure 300 includes a modified breakdown STI region 302 and a modified n-well region 304 to decrease a drain to source resistance of the LDMOS structure 300 when compared to the drain to source resistance of the LDMOS structure 200 while further increasing the breakdown voltage as compared to the LDMOS structure 200 as described above. The modified breakdown STI region 302 is substantially similar to the modified breakdown STI region 202 as described above.

As shown in exploded view 310, the modified n-well region 304 includes a first heavily doped region of substantially similar conductivity as the modified n-well region 304 to form a heavily doped well region 306. The CMOS logic foundry technology fabricates the heavily doped well region 306 between the modified breakdown STI region 302 and the source region 104 below the gate region 110 within the modified n-well region 304. The CMOS logic foundry technology may implant the heavily doped well region 306 with N+ material to form an N+ region. The CMOS logic foundry may optionally include a second lightly doped region of substantially similar conductivity as the modified n-well region 304 to form an optional lightly doped well region 308. The CMOS logic foundry technology fabricates the optional lightly doped well region 308 between the modified breakdown STI region 302 and the source region 104 below the gate region 110 within the modified n-well region 304. The CMOS logic foundry technology may form the optional lightly doped well region 308 to have a horizontal length that is greater than a horizontal length of the heavily doped well region 306 as shown in FIG. 3A. Alternatively, the CMOS logic foundry technology may form the optional lightly doped well region 308 to have the horizontal length that is less than or equal to the horizontal length of the heavily doped well region 306. The CMOS logic foundry may optionally implant the optional lightly doped well region 308 with n-type material having a doping density less than a doping density of the first heavily doped well region 306. Implanting the modified n-well region 304 with the heavily doped well region 306 and/or the optional lightly doped well region 308 increases the number of carrier electrons located in the modified n-well region 304 when compared to the n-well region 124. This reduces the drain to source resistance of the LDMOS structure 300 when compared to the LDMOS structure 200, thereby increasing the breakdown voltage of the LDMOS structure 300 when compared to the breakdown voltage of the conventional LDMOS structure 200.

Doping Profile of the Modified N-Well Region

Figure 3B:
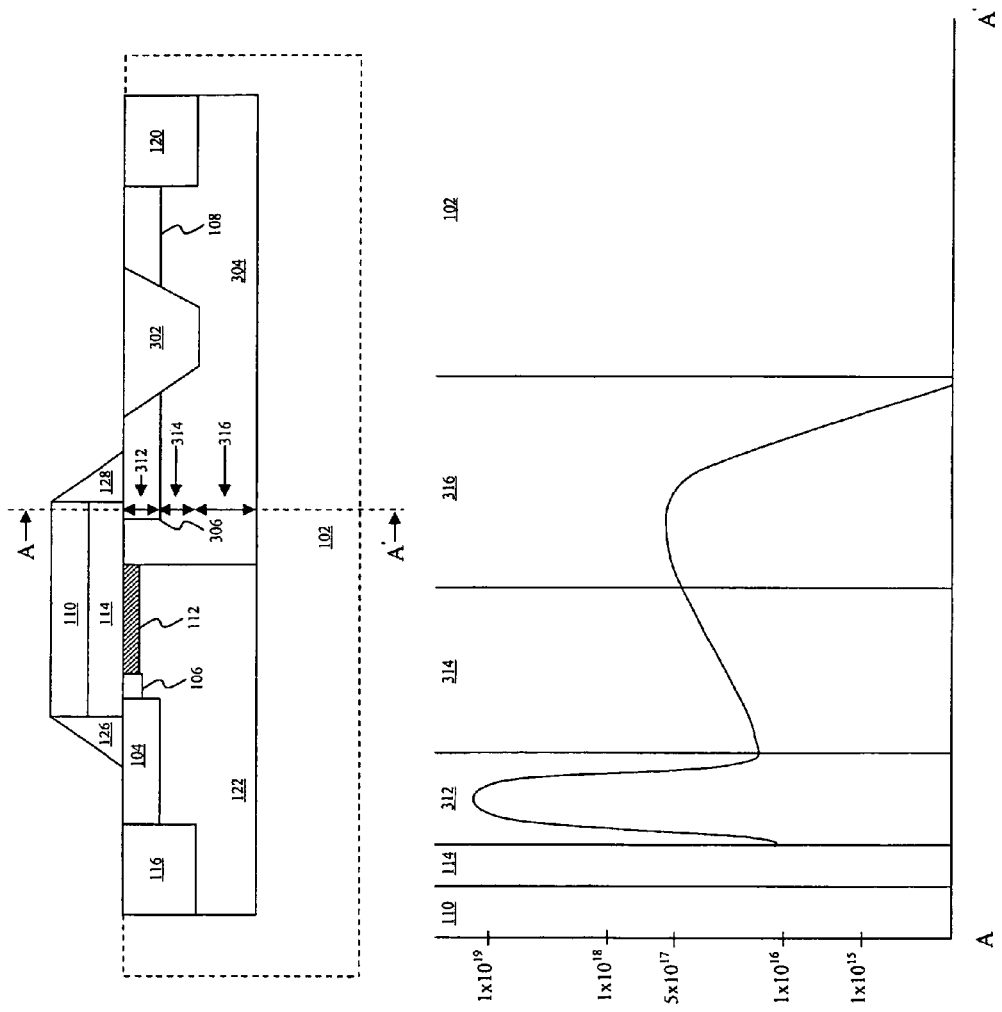
FIG. 3B illustrates a first doping profile of a modified n-well region formed within the n-type LDMOS structure according a first exemplary embodiment of the present invention.

FIG. 3B illustrates a first doping profile of a modified n-well region formed within the n-type LDMOS structure according a first exemplary embodiment of the present invention. In particular, FIG. 3B illustrates the doping profile of the modified n-well region 304 without the optional lightly doped well region 308 along a cross section of the n-type LDMOS structure 300 as designated by the broken line A-A'. As shown in FIG. 3B, the broken line A-A' passes through the gate region 110, the gate oxide 114, a first region 312 of the modified n-well region 304, a second region 314 of the modified n-well region 304, a third region 316 of the modified n-well region 304, and the substrate 102. The first region 312 represents a portion of the modified n-well region 304 extending from the bottom of the gate oxide 114 until substantially horizontally aligned with a bottom side of the heavily doped well region 306. The second region 314 extends from the first region 312 until substantially horizontally aligned with the bottom side of the modified breakdown STI region 302. The third region 316 extends from the second region 314 to a bottom side of the modified n-well region 304. The second region 314 and the third region 316 are substantially similar to the second region 178 and the third region 180, respectively, as described above. Therefore, only the first region 312 is to be described in further detail below.

As further shown in FIG. 3B, the CMOS logic foundry technology may heavily implant the modified n-well region 304 with a high energy implant having a doping density of approximately $$\frac{1 \times 10^{19} \text{ atoms}}{\text{cm}^3}$$

to form the heavily doped well region 306. The CMOS logic foundry technology may concentrate the high energy implant into the first region 312 during formation of the modified n-well region 304 such that the doping destiny of the first region 312 is greater than the second region 314 and the third region 316.

Figure 3C:
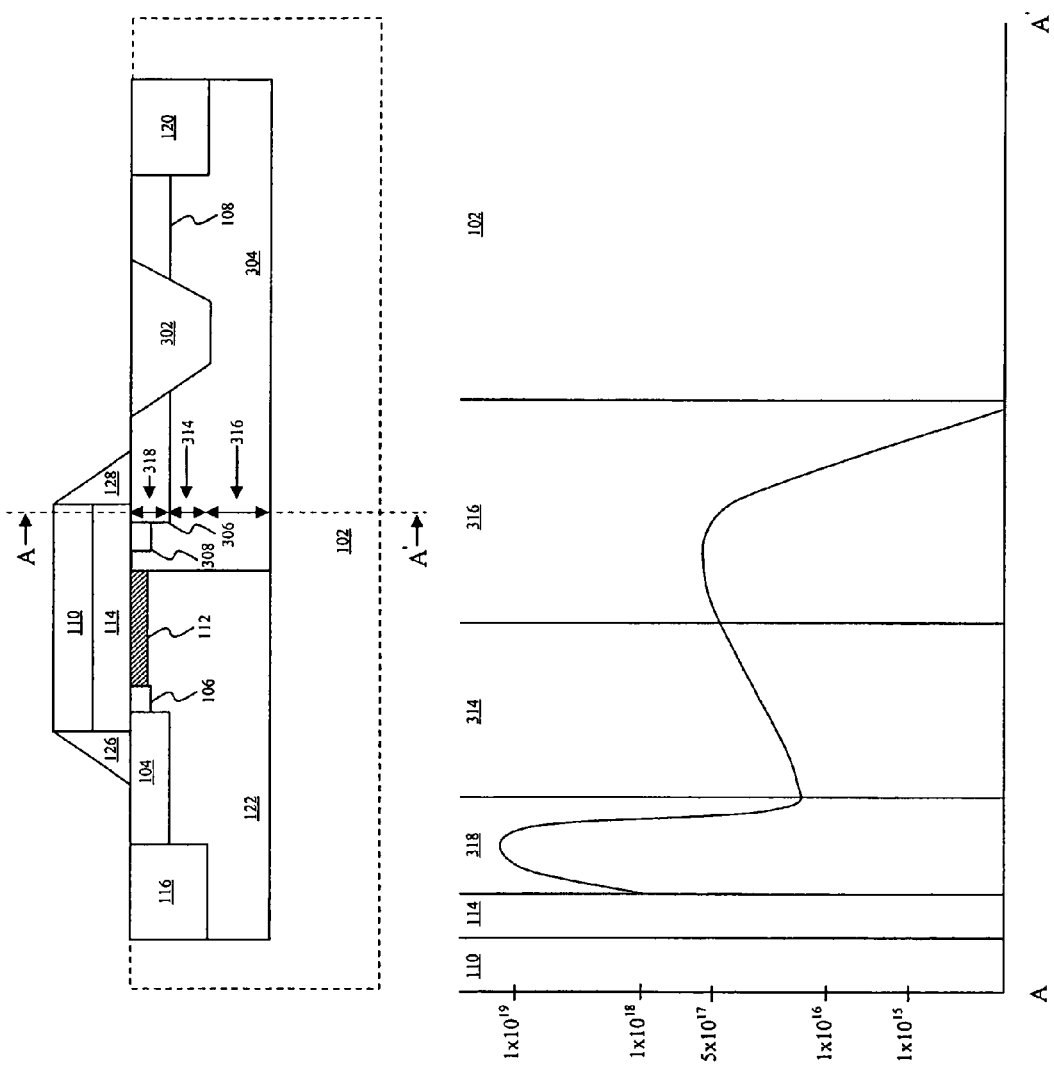
FIG. 3C illustrates a second doping profile of a modified n-well region formed within the n-type LDMOS structure according to a second exemplary embodiment of the present invention.

FIG. 3C illustrates a second doping profile of a modified n-well region formed within the n-type LDMOS structure according to a second exemplary embodiment of the present invention. In particular, FIG. 3C illustrates the doping profile of the modified n-well region 304 including the optional lightly doped well region 308 along a cross section of the n-type LDMOS structure 300 as designated by the broken line A-A'. As shown in FIG. 3C, the broken line A-A' passes through the gate region 110, the gate oxide 114, a first region 318 of the modified n-well region 304, a second region 314 of the modified n-well region 304, a third region 316 of the modified n-well region 304, and the substrate 102. The first region 318 represents a portion of the modified n-well region 304 extending from the bottom of the gate oxide 114 until substantially horizontally aligned with a bottom side of the heavily doped well region 306. The second region 314 extends from the first region 318 until substantially horizontally aligned with the bottom side of the modified breakdown STI region 302. The third region 316 extends from the second region 314 to a bottom side of the modified n-well region 304. The second region 314 and the third region 316 are substantially similar to the second region 178 and the third region 180, respectively, as described above. Therefore, only the first region 318 is to be described in further detail below.

As further shown in FIG. 3C, the CMOS logic foundry technology may heavily implant the modified n-well region 304 with the high energy implant to form the heavily doped well region 306 in a substantially similar manner as described above in FIG. 3B. The CMOS logic foundry technology may implant the modified n-well region 304 with a second high energy implant having a doping density of approximately $$\frac{1 \times 10^{18} \text{ atoms}}{\text{cm}^3}$$

to form the optional lightly doped well region 308. Implanting the modified n-well region 304 with the optional lightly doped well region 308 in this manner increases the doping density of the modified n-well region 304 from approximately $$\frac{5 \times 10^{17} \text{ atoms}}{\text{cm}^3},$$

as described in FIG. 3B, to approximately $$\frac{1 \times 10^{18} \text{ atoms}}{\text{cm}^3}$$

at an interface between the bottom side of a gate oxide 114 and the first region 318. As a result, the optional lightly doped well region 308 increases the breakdown voltage LDMOS structure 300 when compared to the breakdown voltage of the LDMOS structure 300 without the optional lightly doped well region 308.

Breakdown Voltage of the First LDMOS Structure

Figure 3D:
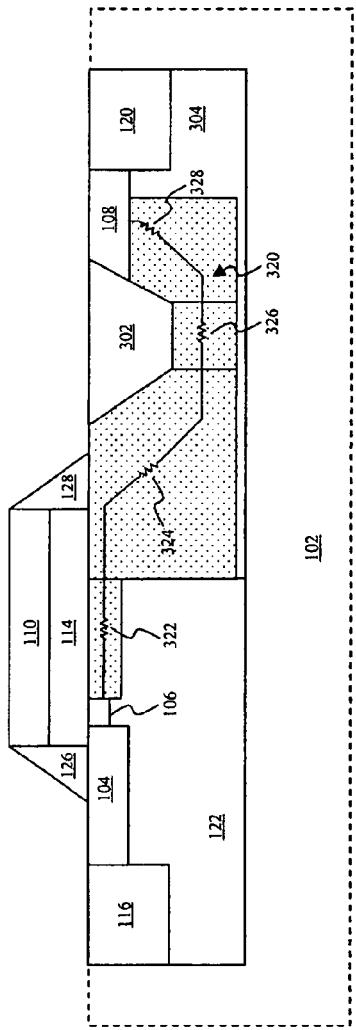
FIG. 3D illustrates a cross-sectional view of a drain to source resistance of the second n-type LDMOS structure according to an exemplary embodiment of the present invention.

FIG. 3D illustrates a cross-sectional view of a drain to source resistance of the second n-type LDMOS structure according to an exemplary embodiment of the present invention. More specifically, FIG. 3D illustrates the cross-sectional view of a drain to source resistance 320 of the LDMOS structure 300 in an on-state, namely after the sufficient number of carrier electrons have accumulated in the channel region 112 allowing the current to pass through the channel region 112.

As illustrated in FIG. 3D, the drain to source resistance 320 may be represented by multiple serial drain to source resistances. A first drain to source resistance 322 extends substantially horizontally from the source region 104; or the from the LDD region 106, to the modified n-well region 304. The first drain to source resistance 322 includes the channel region 112. A second drain to source resistance 324 extends substantially vertically from the first drain to source resistance 322 to a third drain to source resistance 326. The second drain to source resistance 324 represents a drain to source resistance of the modified n-well region 304 along a first slanted edge of the modified breakdown STI region 302. The third drain to source resistance 326 extends substantially horizontally from the second drain to source resistance 324 to a fourth drain to source resistance 328. The third drain to source resistance 326 represents a drain to source resistance of the modified n-well region 304 along a bottom edge of the modified breakdown STI region 302. The fourth drain to source resistance 328 extends substantially vertically from the third drain to source resistance 326 to the drain region 108. The fourth drain to source resistance 328 represents a drain to source resistance of the modified n-well region 304 along the second slanted edge 212 of the modified breakdown STI region 302.

Voltage Potential Profile of the First LDMOS Structure

Figure 3E:
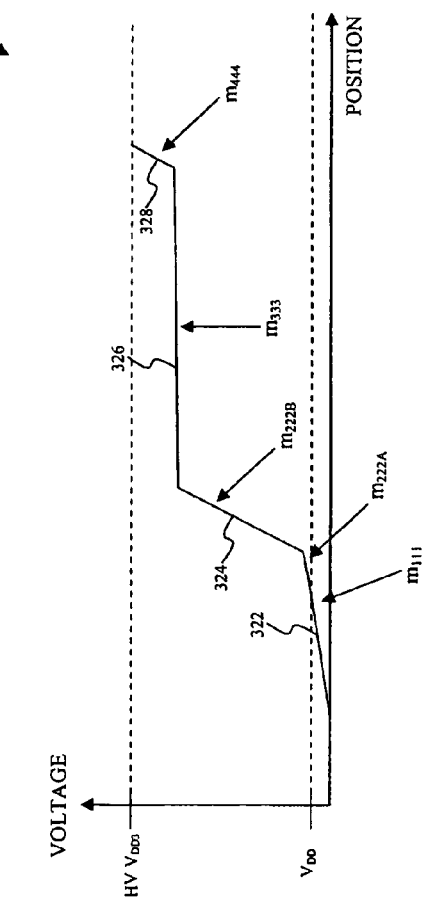
FIG. 3E illustrates a voltage potential profile of the second n-type LDMOS structure according to an exemplary embodiment of the present invention.

FIG. 3E illustrates a voltage potential profile of the second n-type LDMOS structure according to an exemplary embodiment of the present invention. More specifically, FIG. 3E illustrates a voltage potential profile 330 of the LDMOS structure 300 as a function of position and voltage. The voltage potential profile 330 represents a voltage dissipated by the drain to source resistance 320 along the depletion region extending from the source region 104 to the drain region 108. The first drain to source resistance 322 dissipates from approximately zero volts to approximately a first voltage VDD. The second drain to source resistance 324 through the fourth drain to source resistance 328 dissipate from approximately the first voltage $V_{DD}$ to approximately a third high voltage HV $V_{DD3}$, the third high voltage HV $V_{DD3}$ being greater than the second high voltage HV $V_{DD2}$.

The voltage potential profile of the first drain to source resistance 322 increases at a first rate $m_{111}$ as a function of position such that the voltage potential at the source region 104, or at the LDD region 106, is less than the voltage potential at the second drain to source resistance 324. The first rate $m_{111}$ represents a rate of increase of the voltage potential of the first drain to source resistance 322 along the depletion region extending from the source region 104 to the second drain to source resistance 324.

The voltage potential profile of the second drain to source resistance 324 increases at a second rate $m_{222}$ as a function of position such that the voltage potential at the second drain to source resistance 324 is less than the voltage potential at the third drain to source resistance 326. The second rate $m_{222}$ represents a rate of increase of the voltage potential of the second drain to source resistance 324 along the depletion region extending from the first drain to source resistance 322 to the third drain to source resistance 326.

As shown in FIG. 3E, the second rate $m_{222}$ may include a first portion $m_{222A}$ and a second portion $m_{222B}$. The first portion $m_{222A}$ represents a rate of increase of the voltage potential of the second drain to source resistance 324 along the depletion region extending from the gate oxide 114, along the first slanted edge 210, until substantially horizontally aligned with a bottom side of the channel region 112. The first portion $m_{222A}$ is less than the first portion $m_{224}$ as described in FIG. 2C. More specifically, the heavily doped well region 306 allows for more current to pass from the source region 104 to the drain region 108, thereby further reducing the drain to source resistance of the LDMOS structure 300 when compared to the LDMOS structure 200. As a result, the voltage potential of the second drain to source resistance 324 along the depletion region in this region within the modified breakdown STI region 302 increases at a rate that is less than a similar region with the modified breakdown STI region 202 of the LDMOS structure 200. The first portion $m_{222A}$ may be decreased even further by including the optional lightly doped well region 308. The optional lightly doped well region 308 further allows for more current to pass from the source region 104 to the drain region 108, thereby further reducing the drain to source resistance of the LDMOS structure 300 when compared to the LDMOS structure 200.

The second portion $m_{222B}$ represents a rate of increase of the voltage potential of the second drain to source resistance 324 along the depletion region extending from the first portion $m_{222A}$, along the first slanted edge of the modified breakdown STI region 302, to the third drain to source resistance 326. The second portion $m_{222B}$ extends substantially vertically from the first portion $m_{222A}$, along the first slanted edge of the modified breakdown STI region 302, to the third drain to source resistance 326.

The voltage potential profile of the third drain to source resistance 326 increases at a third rate $m_{333}$ as a function of position such that the voltage potential at the third drain to source resistance 326 is less than the voltage potential at the fourth drain to source resistance 328. The third rate $m_{333}$ represents a rate of increase of a voltage potential of the third drain to source resistance 326 along the depletion region extending from the second drain to source resistance 324, along the bottom edge of the LDMOS structure 300, to the fourth drain to source resistance 328.

The voltage potential profile of the fourth drain to source resistance 328 increases at a fourth rate $m_{444}$ as a function of position such that the voltage potential at the fourth drain to source resistance 328 is less than the voltage potential at the drain region 108. The fourth rate $m_4$ represents a rate of increase of a voltage potential of the fourth drain to source resistance 328 along the depletion region extending from the third drain to source resistance 326, along a slanted edge of the modified breakdown STI region 302, to the drain region 108.

CONCLUSION

Although the LDMOS structures of the present invention have been described as n-type structures those skilled in the relevant art(s) will recognize that p-type structures may be similarly formed by using p-type material instead of n-type material without departing from the spirit and scope of the present invention. These p-type structures may be implanted into a deep n-well region formed within a p-type semiconductor substrate and/or directly implanted into an n-type semiconductor substrate. Additionally, those skilled in the relevant art(s) will recognize that the substrate as described herein may be composed of n-type material without departing from the spirit and scope of the present invention. In this situation, the LDMOS structures of the present invention may be implanted into a deep p-well region formed within the n-type semiconductor substrate.

While various embodiments of the present invention have been described above, it should be understood that they have been presented by way of example, and not limitation. It will be apparent to persons skilled in the relevant art(s) that various changes in form and detail may be made therein without departing from the spirit and scope of the invention. Thus the present invention should not be limited by any of the above-described exemplary embodiments, but should be defined only in accordance with the following claims and their equivalents.

What is claimed is:

1. A transistor, comprising: a first region configured to form a source region of the transistor; a second region configured to form a drain region of the transistor; a third region, positioned between the source region and the drain region, configured to form a gate region of the transistor; a modified breakdown shallow trench isolation (STI) region positioned between the drain region and the gate region, the modified breakdown STI region including at least one slanted edge, the modified breakdown STI region not overlapping the gate region; a modified well region positioned between the drain region and the gate region, the modified well region including a first well region and a second well region, the second well region being heavily doped relative to the first well region and being positioned between the modified breakdown STI region and the first well region; and a gate oxide region positioned beneath the gate region, the first and second well regions being in contact with the gate oxide region.

2. The transistor of claim 1, wherein the source region, the drain region, and the gate region are implanted with n-type material.

3. The transistor of claim 1, wherein the source region, the drain region, and the gate region are implanted with p-type material.

4. The transistor of claim 1, wherein the modified well region is implanted with n-type material.

5. The transistor of claim 1, wherein the modified breakdown STI region includes a top edge, a bottom edge, a first slanted edge, and a second slanted edge, the top edge, the bottom edge, the first slanted edge, and the second slanted edge being configured and arranged to form a quadrilateral.

6. The transistor of claim 5, wherein the quadrilateral is a trapezoid.

7. The transistor of claim 1, wherein the modified breakdown STI region is positioned within the modified well region.

8. The transistor of claim 7, wherein the second well region is positioned between the drain region and the gate region, the second well region contacting the modified breakdown STI region.

9. A transistor, comprising: a first region formed onto a semiconductor substrate forming a source region of the transistor; a second region formed onto the semiconductor substrate forming a drain region of the transistor; a third region formed onto the semiconductor substrate between the source region and the drain region forming a gate region of the transistor; a modified breakdown shallow trench isolation (STI) region formed onto the semiconductor substrate positioned between the drain region and the gate region, the modified breakdown STI region not overlapping the gate region; a modified well region formed onto the semiconductor substrate between the drain region and the gate region, the modified well region including a first well region and a second well region, the second well region being heavily doped relative to the first well region and being positioned between the modified breakdown STI region and the first well region; and a gate oxide region being formed onto the semiconductor substrate below the gate region, the first and the second well regions being in contact with the gate oxide region.

10. The transistor of claim 9, wherein the source region, the drain region, and the gate region are implanted with n-type material.

11. The transistor of claim 9, wherein the source region, the drain region, and the gate region are implanted with p-type material.

12. The transistor of claim 9, wherein the first well region is in contact with the second well region.

13. The transistor of claim 9, wherein the modified breakdown STI region includes at least one slanted edge.

14. The transistor of claim 13, wherein the modified breakdown STI region includes a top edge, a bottom edge, a first slanted edge, and a second slanted edge, the top edge, the bottom edge, the first slanted edge, and the second slanted edge being configured and arranged to form a quadrilateral.

15. The transistor of claim 13, wherein the quadrilateral is a trapezoid.

16. The transistor of claim 12, wherein the second well region is formed between the drain region and the gate region, the second well region contacting the modified breakdown STI region.

* * * * *